(12) United States Patent
Hsu

(10) Patent No.: US 6,274,468 B1
(45) Date of Patent: Aug. 14, 2001

(54) METHOD OF MANUFACTURING BORDERLESS CONTACT

(75) Inventor: Chen-Chung Hsu, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/173,487

(22) Filed: Oct. 4, 1998

(30) Foreign Application Priority Data

Jul. 6, 1998 (TW) .................................................. 87110883

(51) Int. Cl.⁷ .................................................. H01L 21/3205
(52) U.S. Cl. ........................ 438/586; 438/597; 438/618; 438/637
(58) Field of Search ........................... 438/586, 597, 438/618, 621, 637, 638, 675

(56) References Cited

U.S. PATENT DOCUMENTS

| | | | |
|---|---|---|---|
| 5,118,382 | * 6/1992 | Cronin et al. | 438/740 |
| 5,654,231 | * 8/1997 | Liang et al. | 438/197 |
| 5,807,779 | * 9/1998 | Liaw | 438/279 |
| 5,811,357 | * 9/1998 | Armacost et al. | 438/723 |
| 5,899,742 | * 5/1999 | Sun | 438/682 |

* cited by examiner

Primary Examiner—Stephen D. Meier
Assistant Examiner—Jeff Vockrodt
(74) Attorney, Agent, or Firm—Jiawei Huang; J.C. Patents

(57) ABSTRACT

A method of manufacturing borderless contact can compensate for misalignment that occurs during formation of the contacts. First, a substrate with a gate structure on it is provided. The substrate also has source/drain regions. Spacers are formed on the sidewalls of the gate structure. Thereafter, an insulating layer conformal to the substrate profile is formed over the substrate. Then, a portion of the insulating layer is removed so that the remaining isolating layer at least covers the gate structure and the source/drain regions. Next, a dielectric layer having openings is formed over the insulating layer, and then a portion of the insulating layer at the bottom of the openings is removed to expose the source/drain region, thereby forming contact openings. Finally, conductive material is deposited into the contact openings to form contacts that couple electrically with the respective source/drain regions.

16 Claims, 5 Drawing Sheets

METHOD OF MANUFACTURING BORDERLESS CONTACT

CROSS-REFERENCE TO RELATED APPLICATION

This application claims the priority benefit of Taiwan application serial no. 87110883, filed Jul. 6, 1998, the full disclosure of which is incorporated herein by reference.

BACKGROUND OF THE INVENTION

1. Field of Invention

The present invention relates to a method of manufacturing a contact. More particularly, the present invention relates to a method of manufacturing a borderless contact.

2. Description of Related Art

Conventionally, when an inter-layer dielectric (ILD) layer is patterned to form a contact opening, border strips around the periphery of the contact are normally reserved according to the design rules. Thus, even when the contact opening is misaligned, undesirable leakage current can be prevented.

Nowadays, due to the high level of integration of semiconductor devices, line width has shrunk to around 0.25 $\mu$m and below. Therefore, the newer generation of contacts is fabricated according to a borderless design concept that minimizes area occupation of each device.

However, when a borderless contact opening is patterned, occurrence of any misalignment diminishes contact area between the source/drain region and the contact. In other words, contact resistance between a contact and the source/drain region will rise. In a serious situation, contact may be formed in a position so far from the source/drain region that an open circuit condition arises.

FIGS. 1A through 1D are cross-sectional views showing the progression of manufacturing steps in producing a borderless contact according to a conventional method.

First, as shown in FIG. 1A, a device isolation structure 101, for example, shallow trench isolation, is formed over the substrate 100. The device isolation structure 101 marks out the main active area in which a device is to be formed. Next, a gate structure 102 is formed on the substrate 100 and source/drain regions 110 are formed in the substrate 100. The gate structure 102 comprises a gate oxide layer 104, a gate conductive layer 106 and a cap layer 108. In addition, spacers 112 are formed on the sidewalls of the gate structure 102. The source/drain regions 110 have lightly doped drain (LDD) structures. Preferably, the LDD structures are formed by first carrying out an ion implantation using the gate structure 102 as a mask to form lightly doped source/drain regions. Then, another ion implantation is performed using the spacers 112 as masks to form the heavily doped source/drain regions.

Next, as shown in FIG. 1B, a dielectric layer 116 is formed over the substrate 100 and covers at least the entire gate structure 102. The dielectric layer 116 can be, for example, a silicon oxide layer formed by a chemical vapor deposition (CVD) method. Thereafter, the dielectric layer 116 is planarized so that a thickness roughly equal to the height of the subsequently formed contact remains. The dielectric layer 116 can be planarized using, for example, a chemical-mechanical polishing (CMP) method.

Next, as shown in FIG. 1C. conventional photolithographic and etching processes are used to pattern the dielectric layer 116, in which processes contact openings that ought to expose the source/drain regions 110 are formed. However, due to the misalignment of the patterned dielectric layer 116a, contact openings 117 and 119 are offset from the position where source/drain regions 110 are formed. In serious situations, as shown in FIG. 1C, the contact opening 117 exposes the cap layer 108 and spacer 112 of the gate structure 102 while the contact opening 119 exposes a portion of the device isolation structure 101.

Next, as shown in FIG. 1D, contacts 118 and 120 are formed inside the respective contact openings 117 and 119 within the insulating layer 116a. In general, the contacts 118 and 120 are formed by first depositing a glue/barrier layer (not shown in FIG. 1D) that is conformal to the contact openings 117 and 119. The glue/barrier layer is formed so that the adhesive strength between the subsequently deposited conductive layer and other material layers is enhanced. Thereafter, a conductive layer (also not shown in FIG. 1D), for example, a tungsten layer, is deposited over the substrate 100 and fills the contact openings 117 and 119. Finally, the conductive layer is removed to expose the insulating layer 116a, thereby forming contacts 117 and 119 inside the contact openings 118 and 120 respectively. The conductive layer can be removed using a chemical-mechanical polishing (CMP) method, for example.

In the aforementioned processing operation, contacts 118 and 120 are unable to make contact with the source/drain regions 110 as required due to severe misalignment when the dielectric layer 116 is patterned to form openings 117 and 119. an open-circuit condition is established, which results in device malfunction.

In light of the foregoing, there is a need to improve the method of manufacturing borderless contact.

SUMMARY OF THE INVENTION

Accordingly, the present invention provides a method of manufacturing a borderless contact that is capable of forming sufficient contact area for coupling a contact with a source/drain region even though the via opening for forming the contact is seriously misaligned relative to the source/drain region.

To achieve these and other advantages and in accordance with the purpose of the invention, as embodied and broadly described herein, the invention provides a method of manufacturing borderless contact. The method includes several steps. First, a substrate is provided that has a gate structure formed thereon. The substrate has source/drain regions and spacers on the sidewalls of the gate structure. Thereafter, an insulating layer conformal to the substrate profile is formed above the substrate. Then, a portion of the insulating layer is removed so that the remaining isolating layer at least covers the gate structure and the source/drain regions. Next, a dielectric layer having openings is formed over the insulating layer, and then a portion of the insulating layer at the bottom of the openings is removed to expose the source/drain region, thereby forming contact openings. Finally, conductive material is deposited into the contact openings to form contacts that electrically couple with the respective source/drain regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings

DESCRIPTION OF THE PREFERRED EMBODIMENTS

Figure 1A:
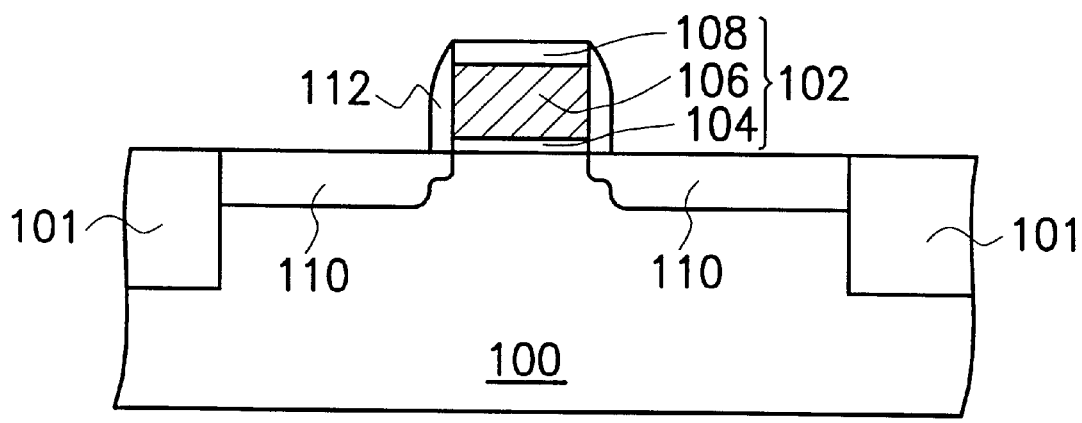
FIGS. 1A through 1D are cross-sectional views showing the progression of manufacturing steps taken in producing a borderless contact according to a conventional method.
Figure 1B:
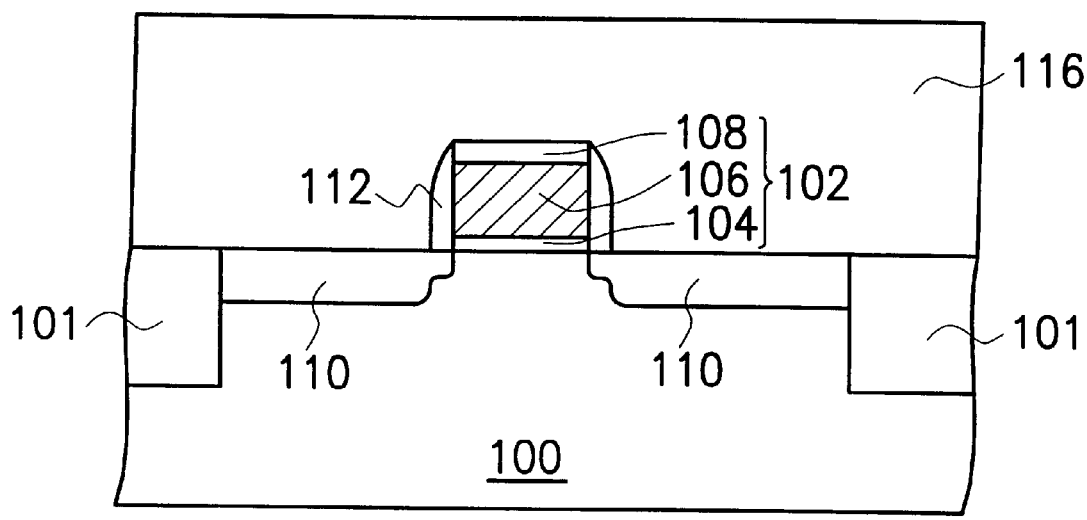
Figure 1C:
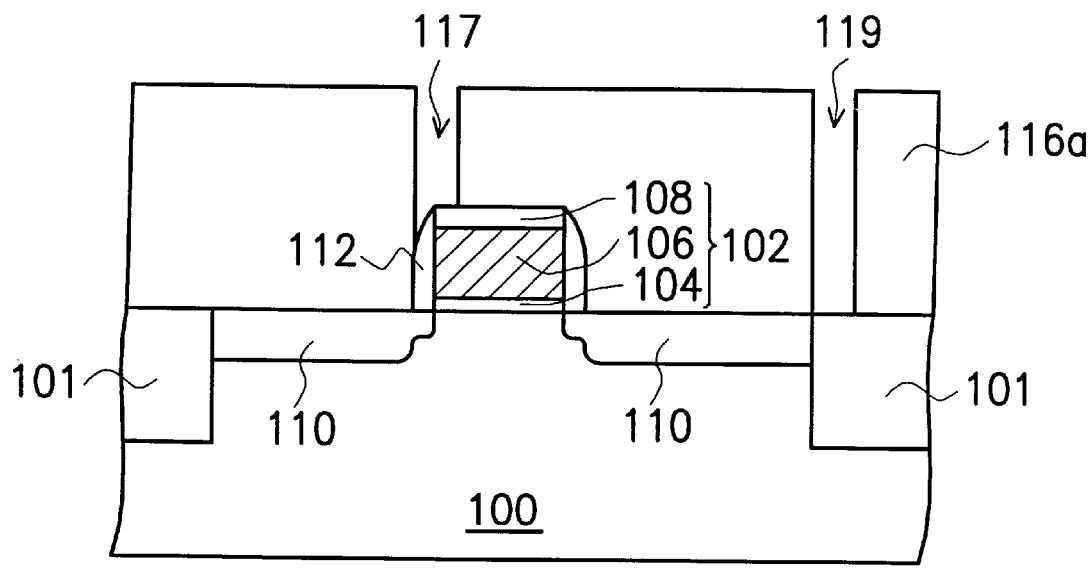
Figure 1D:
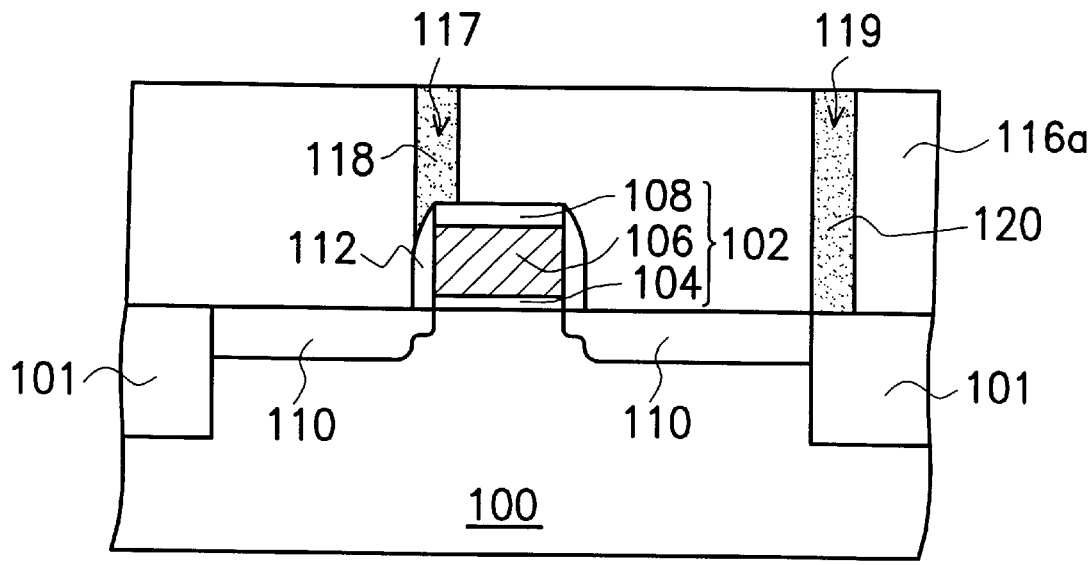

Reference will now be made in detail to the present preferred embodiments of the invention examples of which are illustrated in the accompanying drawings. Wherever possible, the same reference numbers are used in the drawings and the description to refer to the same or like parts.

FIGS. 2A through 2G are cross-sectional views showing the progression of manufacturing steps taken in producing a borderless contact according to one preferred embodiment of this invention.

Figure 2A:
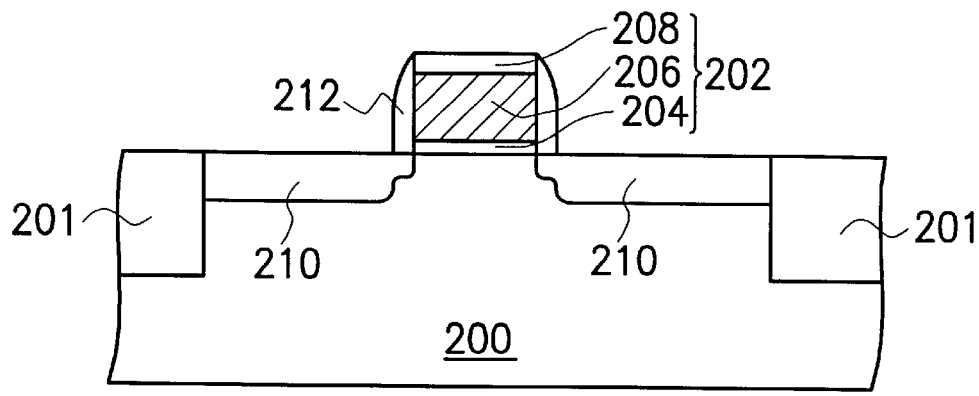
FIGS. 2A through 2G are cross-sectional views showing the progression of manufacturing steps in producing a borderless contact according to one preferred embodiment of this invention.

First, as shown in FIG. 2A, a device isolation structure 201 is formed above a substrate 200. The substrate 200 can be a lightly doped P-type well region or a P-type semiconductor, and the device isolation structure 201 can be a shallow trench isolation (STI) structure, for example. The device isolation structure 201 is used for partitioning out main active areas in which devices are to be formed. In the subsequent step, a gate structure 202 is formed above the substrate 200, and source/drain regions 210 are formed in the substrate 200 on each side of the gate structure 202. The gate structure 202 comprises a gate oxide layer 204, a gate conductive layer 206 and a cap layer 208. Furthermore, spacers 212 are formed on the sidewalls of the gate structure 202.

The gate oxide layer 204 having a thickness of about 30–100 Å can be formed by depositing silicon oxide at a temperature of between 800–1000° C. The gate conductive layer 206 can be a composite layer formed by first depositing doped polysilicon and then depositing metal silicide over the doped polysilicon layer.

The doped polysilicon layer having a thickness of about 1000–3000 Å can be formed by depositing (loped polysilicon over the substrate 200 using a low-pressure chemical vapor deposition (LPCVD) method. In general, impurities for doping the polysilicon layer include arsenic or phosphorus ions. After impurities are implanted into the polysilicon layer, an annealing operation is normally used to activate the dopants so that the polysilicon layer has a higher electrical conductivity.

The doped polysilicon layer can be formed by doping impurities and depositing polysilicon at the same operation. Alternately, a polysilicon layer is formed first, and then dopants are subsequently added in an ion implantation operation. The metal silicide layer having a thickness of about 1000–3000 Å can be, for example, a tungsten silicide layer, a titanium silicide layer or a molybdenum silicide layer. The cap layer 208 can be a silicon oxide layer or a silicon nitride layer. The cap layer 208 having a thickness of about 1500–2000 Å can be formed using, for example, a chemical vapor deposition (CVD) method. The spacers 212 can be formed using a CVD method as well. The spacers 212 are formed by first depositing an insulating layer over the substrate 200, and then etching back the insulating layer.

The source/drain regions 210 have a lightly doped drain (LDD) structure. The LDD structure is formed by performing a first ion implantation to form lightly doped source/drain regions using the cap layer 208 as a mask. For example, arsenic or phosphorus ions are implanted into the substrate using an energy level of between 4080 KeV and a dosage of between $5 \times 10^{12}$–$5 \times 10^4$ ions/cm$^2$. Thereafter, a second ion implantation is performed to form heavily doped source/drain regions using the spacers 212 as masks.

For example, arsenic or phosphorus ions are implanted into the substrate using an energy level of between 50–100 KeV and a dosage of between $1 \times 10^{15}$–$8 \times 10^{15}$ ions/cm$^2$. The lightly doped source/drain region and the heavily doped source/drain region in combination constitute the lightly doped drain (LDD) structure in the source/drain region 210.

Figure 2B:
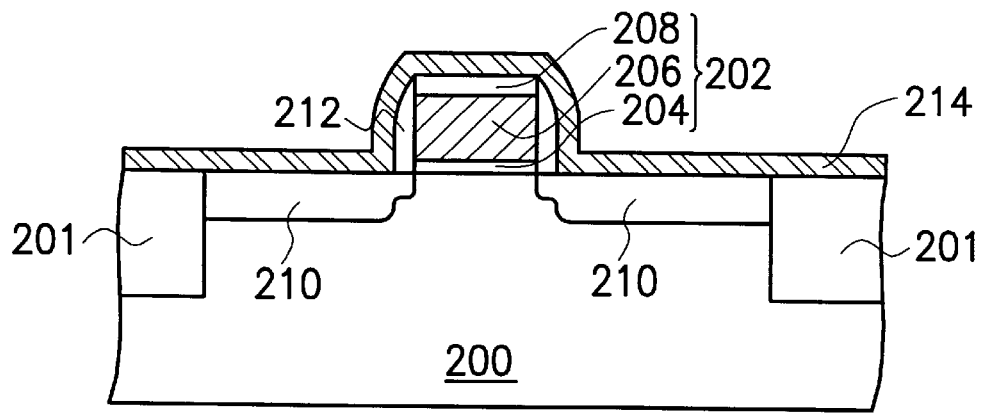

Next, as shown in FIG. 2B, an insulating layer 214 conformal to the profile of the substrate 200 and the gate structure 202 is formed above the substrate 200 using, for example, a chemical vapor deposition (CVD) method. The insulating layer 214 can be a silicon nitride layer or other insulating material that has properties different from the dielectric layer.

Figure 2C:
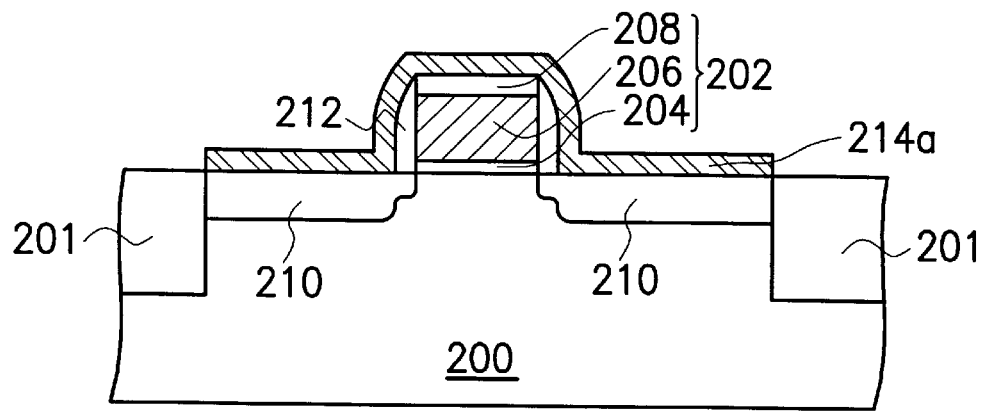

Next, as shown in FIG. 2C, conventional photolithographic and anisotropic etching operations are used to remove a portion of the insulating layer 214. Consequently, an insulating layer 214a that at least covers the gate structure 202 and the source/drain regions 210 (active device region) while exposing the device isolation structure 201 is formed. The purpose of removing a portion of the insulating layer 214 is to prevent undesirable connection between neighboring MOS transistors when the contact openings are formed. Therefore, the aforementioned operation should be carried out according to processing demands.

Figure 2D:
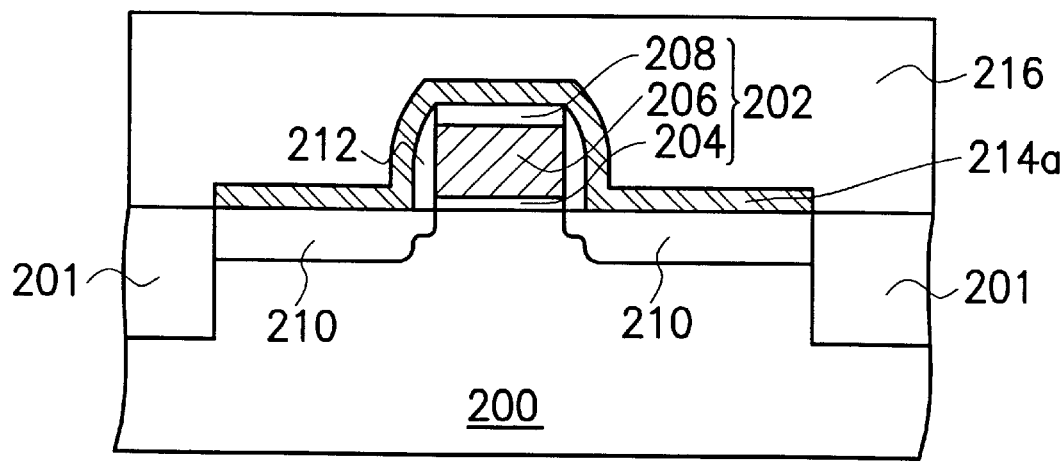

Next, as shown in FIG. 2D, a dielectric layer 216 is formed over the entire substrate 200 and over the insulating layer 214a. The dielectric layer 216 can be a silicon oxide layer formed using, for example, a chemical vapor deposition (CVD) process. Alternately, the silicon oxide layer is formed by a CVD process or a plasma-enhanced chemical vapor deposition (PECVD) process using tetra-ethyl-orthosilicate (TEOS) as the main reactive gas. Thereafter, a planarization operation is carried out to form a dielectric layer 216 having a thickness roughly equal to height of the subsequently formed contact opening. The dielectric layer 216 can be planarized using a chemical-mechanical polishing (CMP) operation, for example.

Figure 2E:
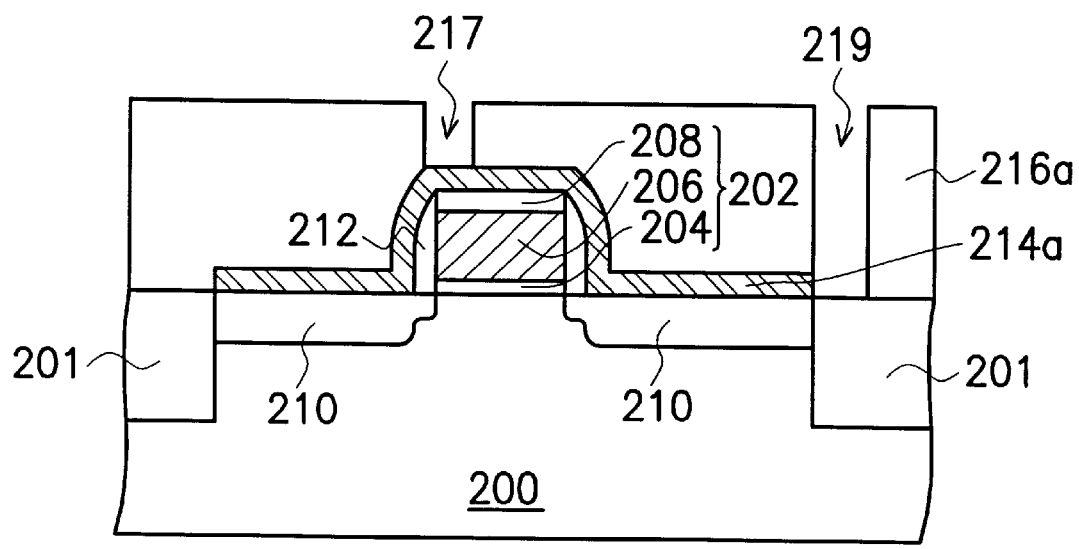

Next, as shown in FIG. 2E, conventional photolithographic and etching operations are a(gain used to pattern the dielectric layer 216, thus forming contact openings 217 and 219 that expose the respective source/drain regions 210. Should misalignment of the contact openings 217 and 219 occur when the dielectric layer 216 is patterned, the contact openings will not align with the respective source/drain regions 210. In the worst case scenario, the contact opening 217 will expose a portion of the insulating layer 214a, whereas the contact opening 219 will expose a portion of the device isolation structure 201.

Figure 2F:
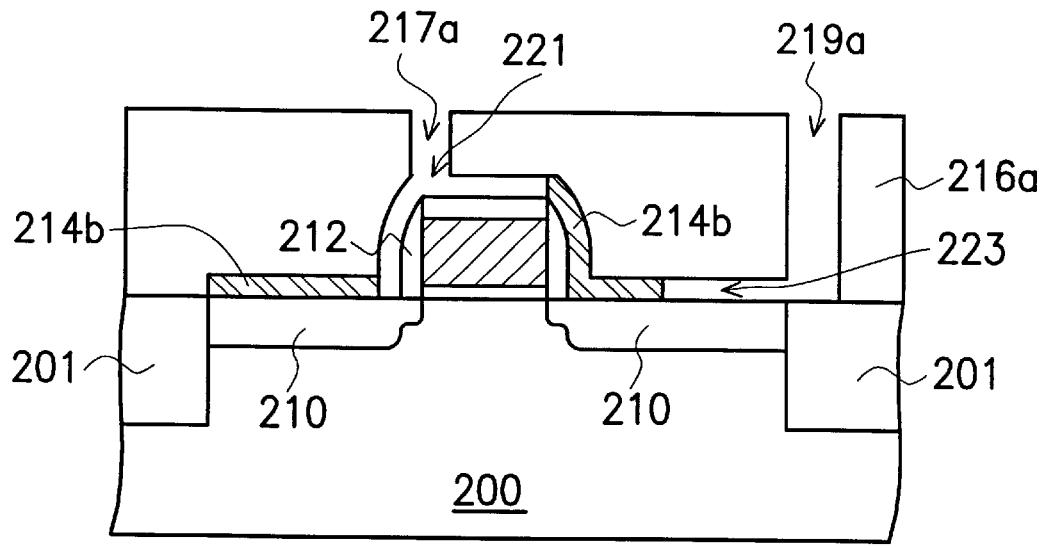

Next, as shown in FIG. 2F, a portion of the exposed insulating layer 214a at the bottom of the openings 217 and 219 is removed. Therefore, cavities 221 and 223 that expose a portion of the source/drain region 210 are formed at the bottom of the openings 217 and 219 respectively thereby forming contact openings 217a and 219a within the dielectric layer 216a.

Preferably the insulating layer 214a is removed by a wet etching method. For example, if the insulating layer 214a is a silicon nitride layer, hot phosphoric acid can be used to conduct a side-etching operation. The cavities 221 and 223 provide channels that lead from the contact openings 217a and 219a to the respective source/drain regions 210. Therefore, the formation of cavities is capable of compensating for a reduction in contact area, and hence an increase in contact resistance, due to misalignment when the dielectric layer 216 is etched to form the contact openings 217 and 219. Furthermore the formation of cavities is capable of reestablishing connection between the contact opening and the source/drain region even when the contact opening is seriously misaligned, thereby preventing an open-circuit condition.

Figure 2G:
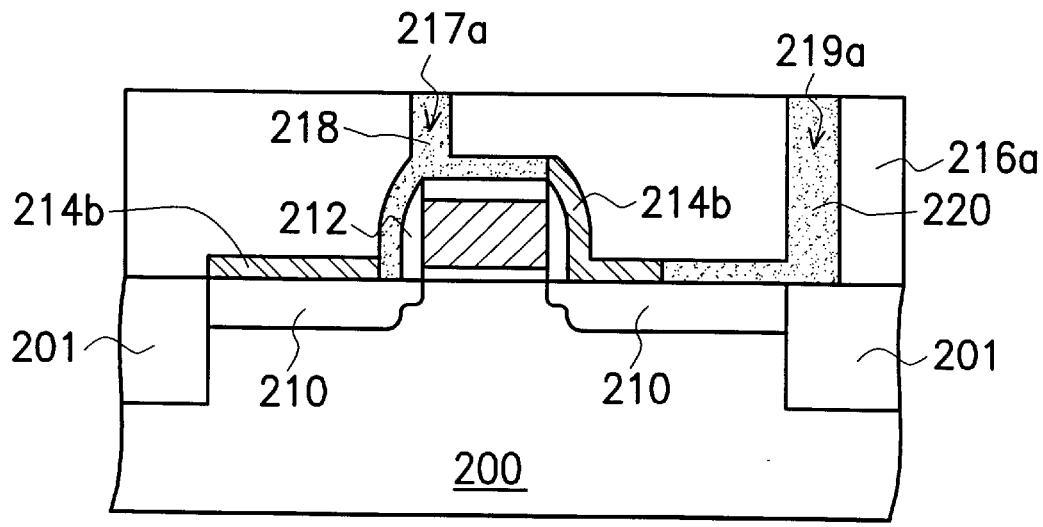

Next, as shown in FIG. 2G, contacts 218 and 220 are formed inside the contact openings 217a and 219a respectively. The contacts 218 and 220 are formed by first depositing material to form a glue/barrier layer (not shown in FIG. 2G) that is conformal to the profiles of the contact openings 217a and 219a. The glue/barrier layer serves to increase the adhesive strength between the subsequently deposited conductive layer and other material layers.

Thereafter a conductive layer, for example, a tungsten layer (not shown in FIG. 2G) is deposited over the substrate 200 and completely fills the contact openings 217a and 219a. Subsequently portions of the conductive layer above the insulating layer 216a are removed using for example, an etching back operation or a chemical-mechanical polishing (CMP) method. Ultimately, contacts 218 and 220 are formed within the insulating layer 216a, wherein each contact is coupled electrically with a source/drain region 210.

In summary major aspects of the invention include:

1. Prior to depositing a dielectric layer over the substrate and patterning the dielectric layer to form a contact opening, an insulating layer is first formed over the entire substrate surface. Therefore, should misalignment of the contact opening occur, the reduction in contact area can still be compensated for by removing a portion of the insulating layer at the bottom of the contact opening. Hence, contact resistance between the contact and the source/drain region can be reduced. Furthermore, the above operation is also capable of re-establishing connection between the contact and the source/drain region even if the contact openings are formed with serious misalignment. In other words, connection can even be restored for an open-circuit condition.

2. Standard semiconductor manufacturing equipment can be used for forming the contacts of this invention, and hence can be easily implemented without any changes in the manufacturing facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a borderless contact, the method comprising the steps of:

providing a substrate having a gate structure formed thereon, a plurality of source/drain regions formed therein, and sidewall spacers formed on each side of the gate structure;

forming an insulating layer conformal to the substrate profile above the substrate;

removing a portion of the insulating layer so that the remaining insulating layer at least covers the gate structure and the source/drain regions;

forming a dielectric layer over the substrate;

forming an opening in the dielectric layer so that a portion of the insulating layer is exposed;

forming a contact opening by removing a portion of the exposed insulating layer at the bottom of the opening so that a portion of the source/drain regions is exposed; and forming a contact inside the contact opening, wherein the contact couples electrically with the source/drain regions.

2. The method of claim 1, wherein the step of forming the insulating layer includes depositing silicon nitride.

3. The method of claim 1, wherein the step of forming the insulating layer includes using a chemical vapor deposition method.

4. The method of claim 1, wherein the step of forming the dielectric layer includes deposition silicon oxide.

5. The method of claim 1, wherein the step of removing a portion of the insulating layer at the bottom of the opening includes using a wet etching method.

6. The method of claim 1, wherein the step of forming the contact further includes the substeps of:

forming a conductive layer over the substrate that completely fills the contact opening; and removing a portion of the conductive layer to expose the dielectric layer so that a contact is formed inside the contact opening, wherein the contact couples electrically with the source/drain regions.

7. The method of claim 6, wherein the step of forming the conductive layer includes depositing tungsten.

8. The method of claim 6, wherein the step of removing a portion of the conductive layer includes using an etching back method or a chemical-mechanical polishing method.

9. A method of manufacturing a borderless contact, the method comprising the steps of:

providing a substrate having a gate structure formed thereon, a plurality of source/drain regions fromed therein, and sidewall spacers formed on each side of the gate structure;

forming a conformal insulating layer on the gate structure, the spacers and the source/drain regions;

after the step of forming the conformal insulating layer, removing a portion of the conformal insulating layer such that the remaining conformal insulating layer at least covers the gate structure and the source/drain regions;

forming a dielectric layer over the insulating layer;

forming an opening in the dielectric layer so that a portion of the insulating layer is exposed;

forming a contact opening by removing a portion of the exposed insulating layer at the bottom of the opening so that a portion of the source/drain regions is exposed; and forming, a contact inside the contact opening, wherein the contact couples electrically with the source/drain regions.

10. The method of claim 9, wherein the step of the forming the insulating layer includes depositing silicon nitride.

11. The method of claim 9, wherein the step of the forming the insulating layer includes using a chemical vapor deposition method.

12. The method of claim 9, wherein the step of the forming the dielectric layer includes deposition silicon oxide.

13. The method of claim 9, wherein the step of removing a portion of the insulating layer at the bottom of the opening includes using a wet etching method.

14. The method of claim 9, wherein the step of forming the contact further includes the substeps of:

forming a conducive layer over the substrate that completely fills the contact opening; and removing a portion of the conductive layer to expose the dielectric layer so that a contact is formed inside the contact opening, wherein the contact couples electrically with the source/drain regions.

15. The method of claim 14, wherein the step of forming the conductive layer includes depositing tungsten.

16. The method of claim 14, wherein the step of removing a portion of the conductive layer includes using an etching back method or a chemical-mechanical polishing method.

* * * * *